US012300606B2

(12) United States Patent
Ikegaya et al.

(10) Patent No.: US 12,300,606 B2
(45) Date of Patent: May 13, 2025

(54) MIRROR CIRCUIT DEVICES WITH WIDE WIRINGS

(71) Applicant: Hitachi Astemo, Ltd., Hitachinaka (JP)

(72) Inventors: Katsumi Ikegaya, Hitachinaka (JP); Yoichiro Kobayashi, Hitachinaka (JP); Minoru Migita, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 713 days.

(21) Appl. No.: 17/611,646

(22) PCT Filed: May 15, 2020

(86) PCT No.: PCT/JP2020/019402
§ 371 (c)(1),
(2) Date: Nov. 16, 2021

(87) PCT Pub. No.: WO2020/235465
PCT Pub. Date: Nov. 26, 2020

(65) Prior Publication Data
US 2022/0221891 A1    Jul. 14, 2022

(30) Foreign Application Priority Data

May 20, 2019  (JP) .................................. 2019-094338

(51) Int. Cl.
| | |
|---|---|
| H01L 21/8234 | (2006.01) |
| G05F 3/26 | (2006.01) |
| H01L 23/528 | (2006.01) |
| H01L 27/02 | (2006.01) |
| H01L 27/088 | (2006.01) |

(52) U.S. Cl.
CPC ...... *H01L 23/5283* (2013.01); *H01L 27/0207* (2013.01); *G05F 3/267* (2013.01); *H01L 27/088* (2013.01)

(58) Field of Classification Search
CPC .................................................... H01L 23/5283
See application file for complete search history.

(56) References Cited

U.S. PATENT DOCUMENTS

| | | | | |
|---|---|---|---|---|
| 4,096,430 A | * | 6/1978 | Waldron | G05F 3/262 |
| | | | | 327/535 |
| 4,723,110 A | | 2/1988 | Voorman | |
| 5,473,243 A | | 12/1995 | Thomas | |
| 5,942,856 A | * | 8/1999 | Koyama | H03F 3/45183 |
| | | | | 345/98 |

(Continued)

FOREIGN PATENT DOCUMENTS

| | | |
|---|---|---|
| JP | S62-200808 A | 9/1987 |
| JP | H02-248107 A | 10/1990 |

(Continued)

OTHER PUBLICATIONS

International Search Report with English translation and Written Opinion issued in corresponding application No. PCT/JP2020/019402 dated Sep. 8, 2020.

*Primary Examiner* — Peter Bradford
(74) *Attorney, Agent, or Firm* — Foley & Lardner LLP

(57) ABSTRACT

In a semiconductor device including a current mirror circuit, a highly reliable semiconductor device that reduces a variation in a mirror ratio of the current mirror circuit and suppresses a change with time in a pairing property of elements can be provided.

9 Claims, 16 Drawing Sheets

(56) References Cited

U.S. PATENT DOCUMENTS

| | | | |
|---|---|---|---|
| 6,002,157 A * | 12/1999 | Kozuka | H01L 27/0207 |
| | | | 257/E27.128 |
| 2003/0057476 A1 | 3/2003 | Morita et al. | |
| 2004/0222528 A1 | 11/2004 | Kunikiyo | |
| 2005/0057580 A1* | 3/2005 | Yamano | G09G 3/325 |
| | | | 345/690 |
| 2006/0119496 A1* | 6/2006 | Tester | G05F 3/262 |
| | | | 341/144 |
| 2006/0220255 A1 | 10/2006 | Oba | |
| 2006/0267147 A1* | 11/2006 | Ota | H01L 27/0211 |
| | | | 257/566 |
| 2011/0121367 A1 | 5/2011 | Yoshimura | |
| 2012/0056274 A1 | 3/2012 | Yoshimura | |
| 2012/0329266 A1 | 12/2012 | Hiramoto et al. | |
| 2018/0211898 A1* | 7/2018 | Oshima | H01L 21/76 |
| 2018/0218936 A1* | 8/2018 | Wada | H01L 29/7826 |
| 2018/0336953 A1* | 11/2018 | Miyazaki | G11C 16/28 |
| 2019/0180810 A1* | 6/2019 | Shimizu | G11C 11/4099 |
| 2021/0233935 A1* | 7/2021 | Oshima | H01L 27/0207 |
| 2023/0378054 A1* | 11/2023 | Chen | H01L 23/5226 |

FOREIGN PATENT DOCUMENTS

| | | |
|---|---|---|
| JP | H09-191252 A | 7/1997 |
| JP | 2001-196372 A | 7/2001 |
| JP | 2003-100899 A | 4/2003 |
| JP | 2007-129075 A | 5/2007 |
| JP | 2010-187005 A | 8/2010 |
| JP | 2011-108994 A | 6/2011 |
| JP | 2012-054502 A | 3/2012 |
| JP | 2013-008926 A | 1/2013 |

* cited by examiner

MIRROR CIRCUIT DEVICES WITH WIDE WIRINGS

TECHNICAL FIELD

The present invention relates to a structure of a semiconductor device configured using a multilayer wiring technique, and particularly relates to an effective technique for application to the semiconductor device in which variation in a pairing property of elements is small and high reliability is required.

BACKGROUND ART

A current mirror circuit that is frequently used in an analog integrated circuit converts an input current into a desired magnification (mirror ratio) and outputs the input current having the desired magnification depending on sizes of MOS transistors on an input side and an output side. In order to operate the semiconductor integrated circuit device including the current mirror circuit with high accuracy, it is required that the variation in the pairing property of the transistors constituting the current mirror circuit is reduce and that aging variation in the pairing property is suppressed.

In the semiconductor integrated circuit device, a metal wiring that connects elements such as transistors, diodes, resistors, and capacitances is usually formed on these elements through an interlayer insulating film (interlayer oxide film). The metal wiring (wiring pattern) is formed by repeating formation of a metal film and an insulating film and pattern formation by lithography.

In general, in the case of forming a multilayer metal wiring, an upper wiring layer far from a transistor is used for connection of a long distance in a chip, a power supply main line, or the like, and a wiring thicker than a lower wiring close to the transistor or a wide wiring is often used in order to reduce impedance. In recent years, in a semiconductor device or the like on which a power transistor controlling a large current is mounted, sometimes a wider and thicker copper redistribution is used as an upper layer of a passivation film of the semiconductor device.

Meanwhile, because the metal film and the insulating film that are formed on the semiconductor substrate have different linear expansion coefficients from the semiconductor substrate, thermal strain is generated in the semiconductor element due to an environmental temperature around the semiconductor element or a temperature change due to self-heating. The thermal strain of the wiring pattern disposed around elements such as transistors and resistors causes dispersion and the variation in an electric characteristic of these elements.

For example, PTL 1 discloses a technique for reducing a change with time of the element caused by the wiring pattern. PTL 1 discloses a technique for reducing an influence of a dummy wiring on the MOS transistor by defining disposition of a dummy wiring on the upper layer of the MOS transistor constituting a pair.

PTL 1 discloses that "a semiconductor device including a mechanical chemical polishing dummy wiring disposed on an upper layer of a transistor, wherein the dummy wiring does not overlap any of the pairing transistors in a plan view, or a portion overlapping a first transistor and a second transistor is disposed so as to be equivalent between the first transistor and the second transistor".

CITATION LIST

Patent Literature

PTL 1: JP 2003-100899 A

SUMMARY OF INVENTION

Technical Problem

As described above, in the upper wiring layer far from the transistor, sometimes the wide wiring is used. These wiring widths are wider than the transistor sizes of the transistors constituting the pair, and sometimes are narrower than an entire arrangement of the pair transistors. When such wide wirings are disposed around the pair transistors, in order to make the wiring patterns equivalent seen from each transistor, the wide wirings is required to bypass the transistor arrangement, and there is a problem in that a chip size increases.

In particular, the influence on the chip size is large because the number of transistors included in the current mirror circuit used in an analog-to-digital converter or the like is large.

An object of the present invention is to provide a highly reliable semiconductor device capable of reducing the variation in a mirror ratio of the current mirror circuit and suppressing the change with time of the pairing property of the elements in the semiconductor device including the current mirror circuit.

Solution to Problem

In order to solve the above problems, a semiconductor device includes: a first semiconductor element group in which a plurality of semiconductor elements are connected in parallel; a second semiconductor element group disposed in a layer identical to the first semiconductor element group and in which a plurality of semiconductor elements are connected in parallel; and a plurality of wirings disposed in an upper layer of the first semiconductor element group and the second semiconductor element group, the plurality of wirings having a width greater than a width of each semiconductor element of the first semiconductor element group and the second semiconductor element group. The first semiconductor element group and the second semiconductor element group form a pair to constitute a circuit having predetermined pair accuracy, and the plurality of wirings are disposed such that a combination of distances in a planar direction from each semiconductor element of the first semiconductor element group to a wiring at a position closest in the planar direction is equal to a combination of distances in the planar direction from each semiconductor element of the second semiconductor element group to a wiring at a position closest in the planar direction.

Advantageous Effects of Invention

According to the present invention, in the semiconductor device including the current mirror circuit, the highly reliable semiconductor device capable of reducing the variation in the mirror ratio of the current mirror circuit and suppressing the change with time of the pairing property of the elements can be implemented.

Problems, configurations, and effects other than those described above will be clarified by the following description of embodiments.

DESCRIPTION OF EMBODIMENTS

Figure 1:
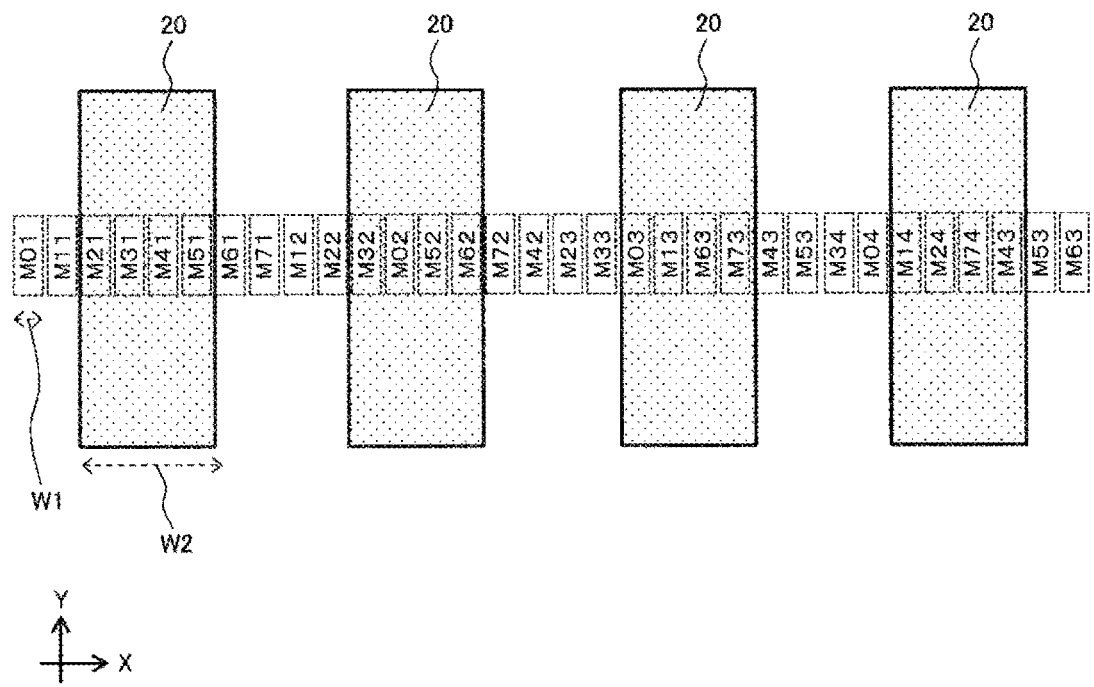
FIG. 1 is a plan view illustrating a semiconductor device according to a first embodiment of the present invention.

Hereinafter, embodiments of the present invention will be described with reference to the drawings. In the drawings, the same component is denoted by the same reference numeral, and the detailed description of overlapping parts is omitted.

First Embodiment

Figure 4:
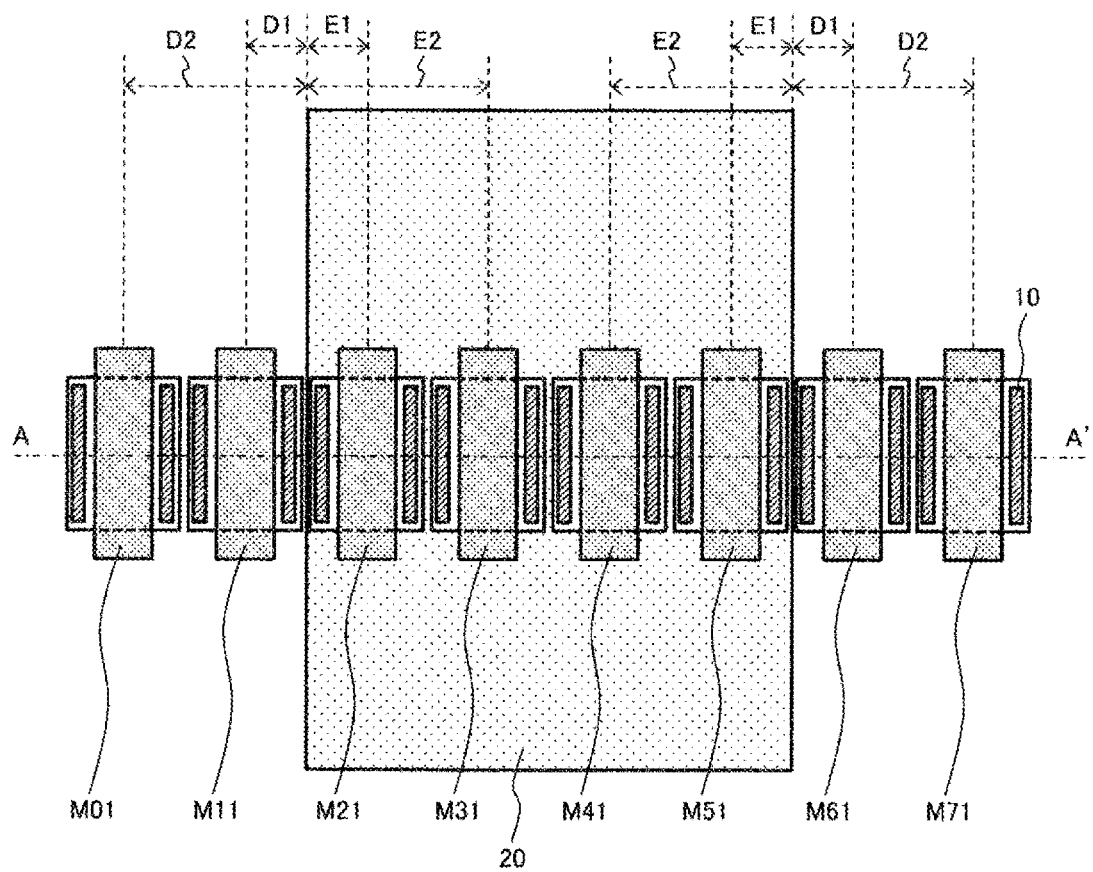
FIG. 4 is a partially enlarged view illustrating the semiconductor device in FIG. 1.
Figure 5:
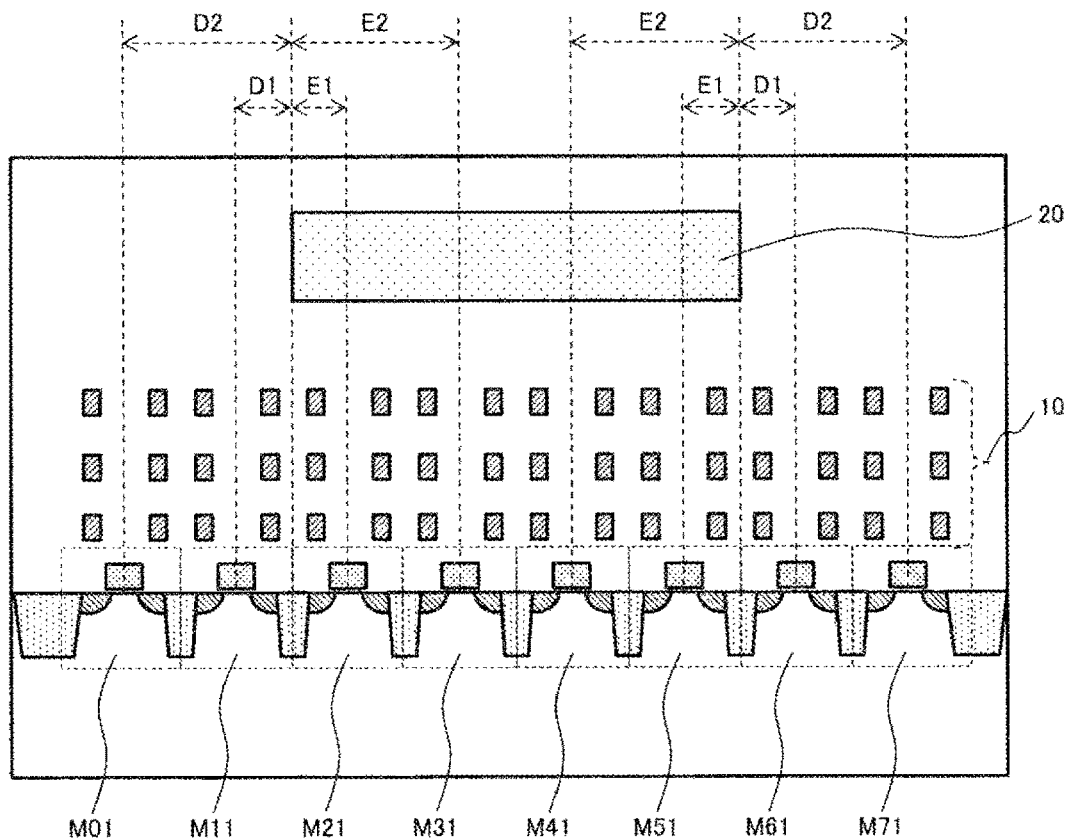
FIG. 5 is a sectional view taken along a line A-A' of FIG. 4.
Figure 6:
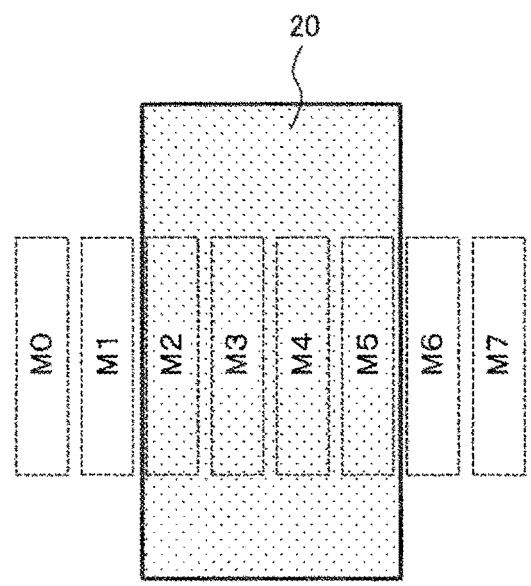
FIG. 6 is a plan view illustrating a semiconductor device of a conventional example.
Figure 7:
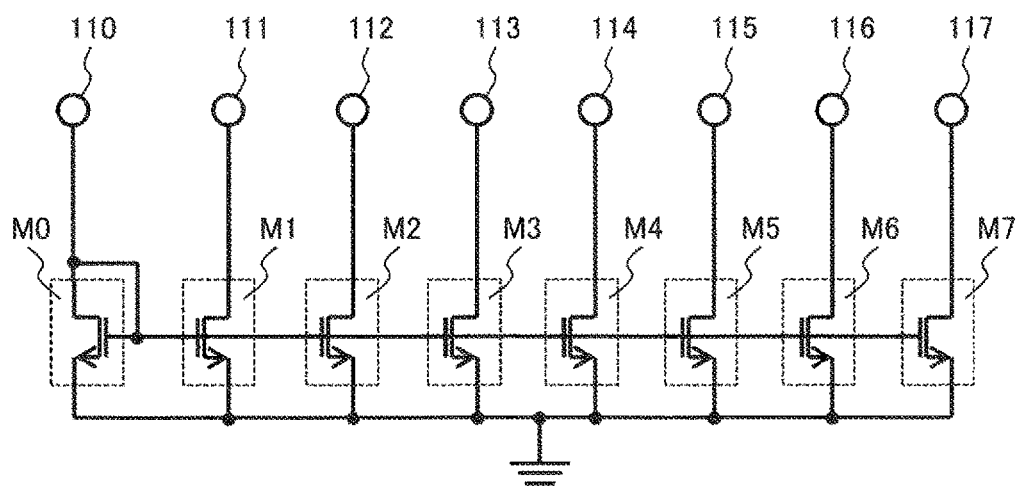
FIG. 7 is a circuit diagram illustrating the semiconductor device of the conventional example.

A semiconductor device according to a first embodiment of the present invention will be described with reference to FIGS. 1 to 7. FIGS. 6 and 7 are a plan view and a circuit diagram illustrating a conventional semiconductor device illustrated as a comparative example in order to facilitate understanding of the present invention.

FIG. 1 is an example illustrating a planar positional relationship between MOS transistors M01 to M74 constituting a current mirror circuit and wide wirings 20 in a semiconductor device of the first embodiment. As illustrated in FIG. 1, the plurality of MOS transistors M01 to M74 are arranged in an X-direction, and each of the plurality of wide wirings 20 is disposed to extend in a Y-direction perpendicular to the MOS transistors M01 to M74. A width W2 of one wide wiring 20 is about 4 times a width W1 of one MOS transistor.

Figure 2:
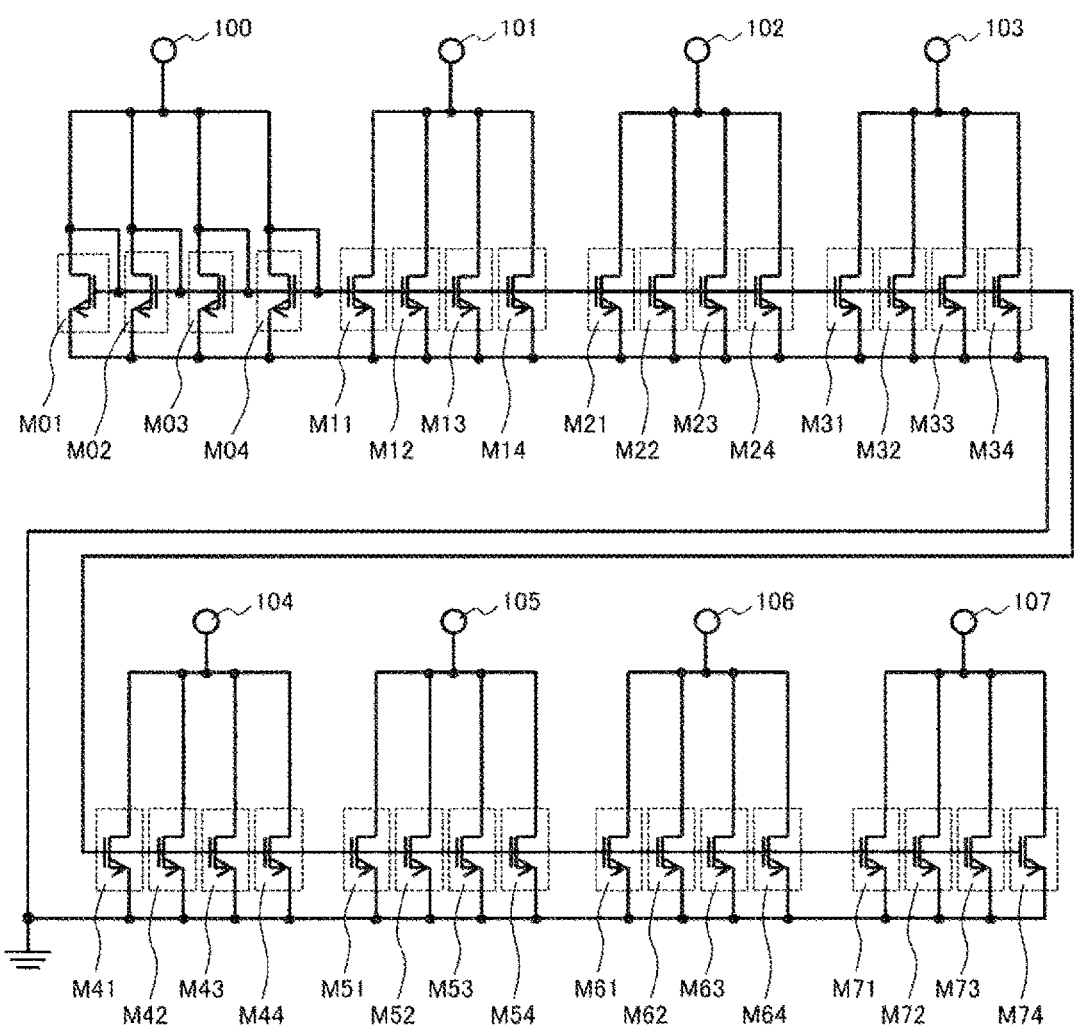
FIG. 2 is a circuit diagram illustrating the semiconductor device of the first embodiment of the present invention.

FIG. 2 is a circuit diagram illustrating the semiconductor device in FIG. 1. A mirror source of a mirror circuit in FIG. 2 is configured by connecting four MOS transistors M01 to M04 in parallel to a mirror terminal 100. A mirror destination is also configured such that four MOS transistors M11 to M14, M21 to M24, and the like are connected in parallel to each of mirror terminals 101 to 107. However, the arrangement order of the MOS transistors in FIG. 1 may be different from that in FIG. 2.

In FIG. 1, the MOS transistors are arranged in parallel in a distributed manner as M01 to M71, M02 to M72, M03 to M73, M04 to M74 from the left.

Furthermore, M01 to M31 are arranged in the order of M01, M11, M21, M31 from the left, and M02 to M32 are changed one by one like M12, M22, M32, M02 from the left. Similarly, M03 to M43 and M04 to M44 are arranged while the order is changed. Similarly, M41 to M71, M42 to M72, M43 to M73, M44 to M74 are arranged while the order is changed one by one.

Figure 3A:
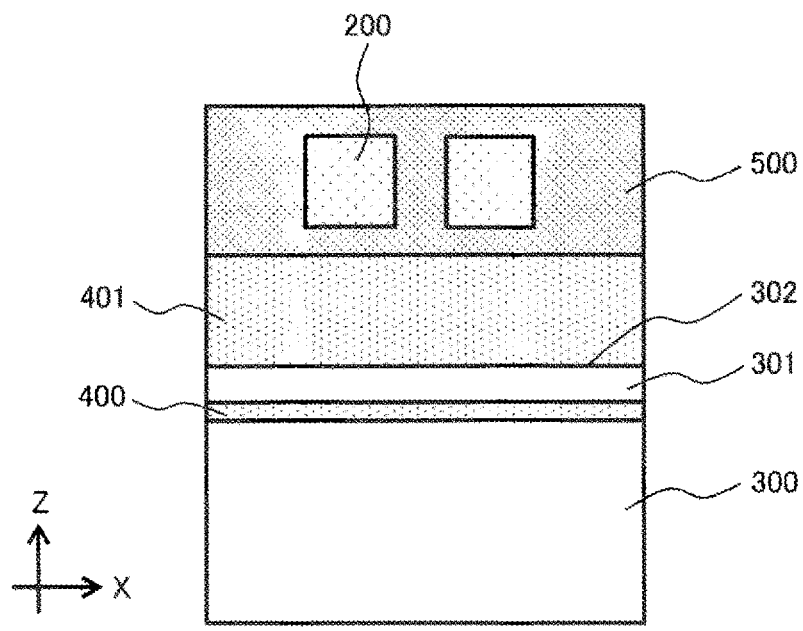
FIG. 3A is a view illustrating a simulation model of thermal strain of a wiring.
Figure 3B:
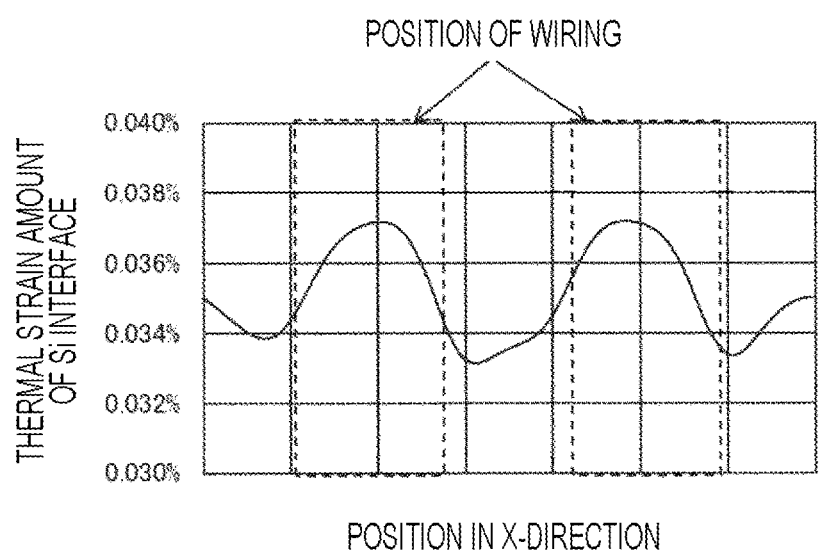
FIG. 3B is a view illustrating a simulation result of a thermal strain by the model in FIG. 3A.

At this point, an influence of stress of a wiring pattern on the MOS transistor will be described with reference to FIGS. 3A and 3B. FIG. 3A is a sectional view illustrating a thermal stress simulation model in which a silicon oxide film 400 that is of an interlayer oxide film, a polyimide film 500, and a copper wiring 200 are disposed on an SOI substrate including a silicon substrate (semiconductor substrate) 300, a silicon oxide film 401, and a silicon (Si) layer 301. FIG. 3B illustrates a simulation result of a strain amount at an interface 302 between the silicon layer 301 and the silicon oxide film 401 in FIG. 3A.

As illustrated in FIG. 3B, the thermal strain of the silicon interface 302 is affected by an upper layer wiring (copper wiring 200), and changes depending on a planar distance from a wiring end. In addition, mobility of electrons and holes in silicon depends on the strain amount of silicon. As described above, because the electric characteristic of the semiconductor element changes depending on the positional relationship with the wiring pattern, it is necessary to consider the disposition, shape, and the like of the upper layer wiring pattern of each element in the semiconductor element in which the pairing property is required.

A detailed positional relationship between the MOS transistor and the wide wiring 20, which are constituents in the first embodiment, will be described below. FIG. 4 is an enlarged plan view illustrating regions of the eight MOS transistors M01 to M71 from the left in FIG. 1. FIG. 5 is a sectional view taken along a line A-A' of FIG. 4. In FIGS. 4 and 5, patterns of wiring layers 10 of an upper layer close to the MOS transistors are laid out so as to be identical as viewed from the respective MOS transistors with respect to the MOS transistors M01 to M71, and the strain given to the MOS transistors by the wiring layers 10 is identical in the respective MOS transistors.

The planar distances from the MOS transistors M01, M11, M21, M31 to the wiring ends of the wide wirings 20 are defined as D2, D1, E1, E2, respectively. The distances in the planar direction from M41 to M71 to the wiring ends of the wide wirings 20 are similar. In M01 to M71, the presence or absence of the upper wide wiring 20 is different from the distance in the planar direction from the wiring end, so that the influence of thermal strain by the wide wiring 20 is different and the pairing property of the MOS transistors is degraded.

However, in the circuit of FIG. 2, when the MOS transistor and the wide wiring 20 are arranged as illustrated in FIG. 1, in a set of the MOS transistors for each mirror terminal 101 to 107 of FIG. 2, a combination of the distances in the planar direction from the MOS transistor to the closest wide wiring 20 is, for example, as follows.

<<Mirror Terminal 100>> (Mirror Source)
Transistors M01 to M04: distances D2, E2, E1, D1 to wide wiring 20
<<Mirror Terminal 101>> (Mirror Destination)
Transistors M11 to M14: distances D1, D2, E2, E1 to wide wiring 20
<<Mirror Terminal 102>> (Mirror Destination)
Transistors M21 to M24: distances E1, D1, D2, E2 to wide wiring 20
<<Mirror Terminal 103>> (Mirror Destination)
Transistors M31 to M34: distances E2, E1, D1, D2 to wide wiring 20

The same applies to the mirror terminals 104 to 107, and the electric characteristic of the MOS for each mirror terminal in FIG. 2 is the same because the mirror terminals 104 to 107 become a combination of (D1, D2, E1, E2). Accordingly, the pairing property between the mirror source and each mirror destination can be secured as the current mirror circuit.

The first embodiment includes: a circuit that includes at least a first semiconductor element group (the group of mirror terminal 100) in which the plurality of semiconductor elements (the MOS transistors M01 to M04) are connected in parallel and a second semiconductor element group (group of mirror terminals 101) in which the plurality of semiconductor elements (MOS transistors M11 to M14) are connected in parallel, the pairing property being required in the circuit; and a plurality of wirings formed above each semiconductor element group (100, 101) and having a width greater than one width of the semiconductor element M01. The plurality of wide wirings 20 are disposed such that the combination of distances (D2, E2, E1, D1) in the planar direction from each semiconductor element (M01 to M04) constituting the first semiconductor element group (100) to the wide wiring 20 at the position closest in the planar direction is equal to the combination of the distances (D1, D2, E2, E1) in the planar direction from each semiconductor elements (M11 to M14) constituting the second semiconductor element group (101) to the wide wiring 20 at the position closest to the planar direction. Thus, the influence of the stress applied from the wide wiring 20 on the first semiconductor element group (the group of the mirror terminals 100) and the influence of the stress applied from the wide wiring 20 on the second semiconductor element group (the group of the mirror terminals 101) can be equalized to each other.

Because a degree of degradation due to the stress can be equalized, the pairing property between the first semiconductor element group (group of mirror terminals 100) and the second semiconductor element group (group of mirror terminals 101) can be maintained, and aging degradation (change with time) can be suppressed.

In the first embodiment, the current mirror circuit has been described as an example of the circuit in which the pairing property is required. However, the present invention is not limited to the current mirror circuit, but can be widely applied to other circuits in which the pairing property (pair accuracy) is required.

In addition, the configuration in which the number of MOS transistors (semiconductor elements) constituting each semiconductor element group is four has been described as an example, but the present invention is not limited thereto. Similarly, the number of semiconductor element groups constituting a circuit in which the pairing property is required is not limited to seven.

On the other hand, in the conventional semiconductor device of FIGS. 6 and 7, the MOS transistors constituting the current mirror circuit are arranged without being dispersed, and in this case, because the influence of the wide wiring 20 varies among the MOS transistors MO to M7, the pairing property of the MOS transistors decreases, and a mirror ratio of the current mirror circuit also varies for each mirror destination.

As described above, the semiconductor device of the first embodiment includes: the first semiconductor element group (the group of the mirror terminal 100) in which the plurality of semiconductor elements (the MOS transistors M01 to M04) are connected in parallel; the second semiconductor element group (the group of the mirror terminal 101) disposed in a layer identical to the first semiconductor element group (the group of the mirror terminal 100) and in which the plurality of semiconductor elements (the MOS transistors M11 to M14) are connected in parallel; and the plurality of wide wirings 20 disposed on an upper layer of the first semiconductor element group (the group of the mirror terminals 100) and the second semiconductor element group (the group of the mirror terminals 101), the wide wiring 20 having the width W2 greater than the width W1 of each semiconductor element of the first semiconductor element group (the group of the mirror terminals 100) and the second semiconductor element group (the group of the mirror terminals 101). The first semiconductor element group (the group of the mirror terminals 100) and the second semiconductor element group (group of mirror terminals 101) form a pair to constitute a circuit having predetermined pair accuracy, and the plurality of wide wirings 20 are disposed such that the combination of distances in the planar direction from each semiconductor element (the MOS transistor M01 to M04) of the first semiconductor element group (the group of the mirror terminal 100) to the wide wiring 20 at the position closest in the planar direction is equal to the combination of distances in the planar direction from each semiconductor element (the MOS transistors M11 to M14) of the second semiconductor element group the (group of the mirror terminal 101) to the wide wiring 20 at the position closest in the planar direction.

Furthermore, the above-described circuit is the current mirror circuit, the first semiconductor element group (group of mirror terminals 100) is the mirror source of the current mirror circuit, and the second semiconductor element group (group of mirror terminals 101) is the mirror destination of the current mirror circuit.

Thus, in the semiconductor device including the current mirror circuit, the highly reliable semiconductor device that reduces the variation in the mirror ratio of the current mirror circuit and prevents the change with time in the pairing property of the elements can be implemented.

Furthermore, the reliability of the in-vehicle electronic control device can be improved by mounting the semiconductor device of the first embodiment on the in-vehicle electronic control device.

Second Embodiment

Figure 8:
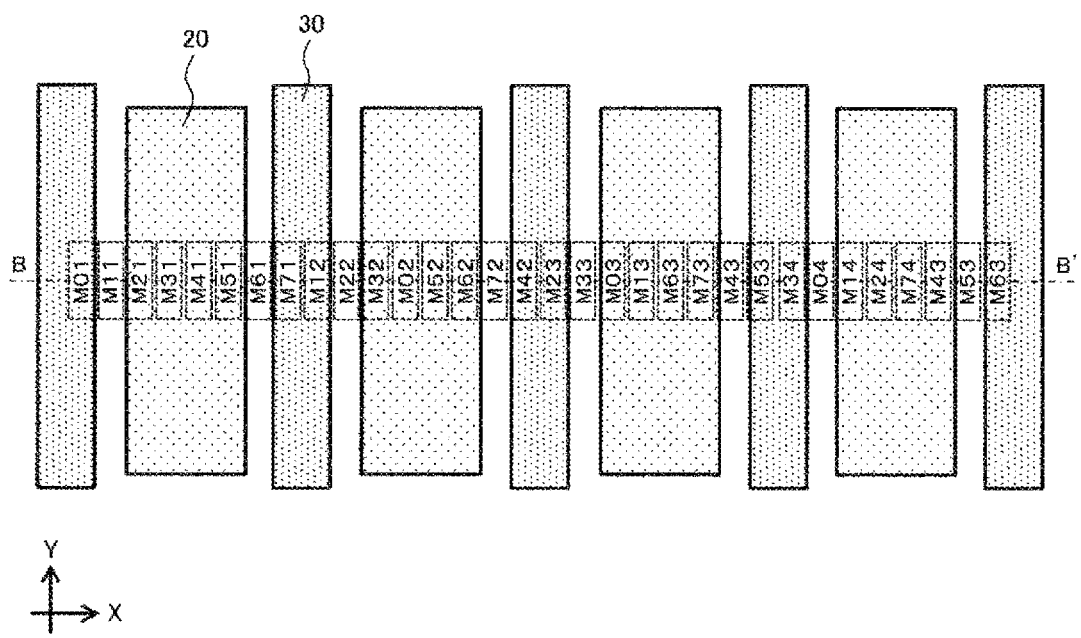
FIG. 8 is a plan view illustrating a semiconductor device according to a second embodiment of the present invention.
Figure 9:
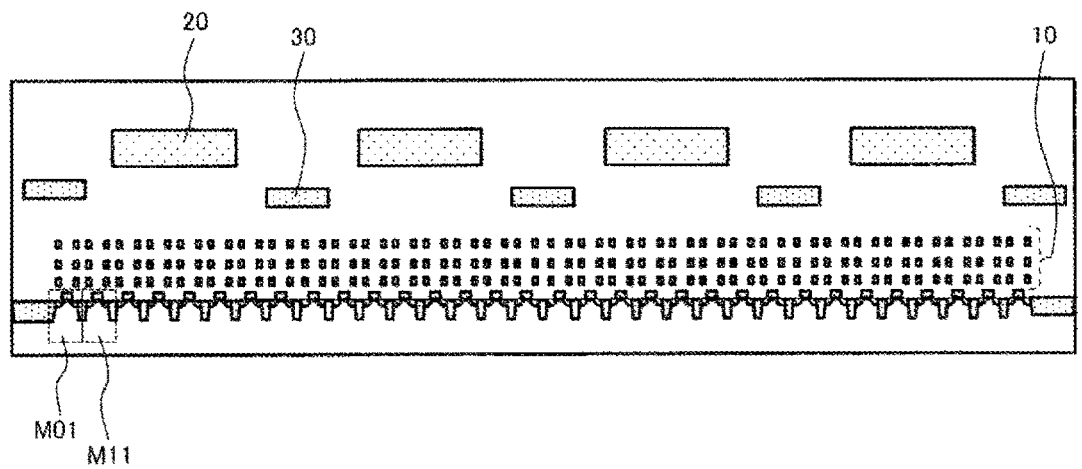
FIG. 9 is a sectional view taken along a line B-B' of FIG. 8.

A semiconductor device according to a second embodiment of the present invention will be described with reference to FIGS. 8 to 11. FIG. 8 is an example illustrating a planar positional relationship among MOS transistors M01 to M74 constituting a current mirror circuit in the semiconductor device of the second embodiment, a wide wiring 20, and a wide wiring 30 in a wiring layer different from the wide wiring 20. In FIG. 8, the MOS transistors M01 to M74 and the wide wiring 20 are the same as those in FIG. 1. The current mirror circuit of the second embodiment is the same as that in FIG. 2. FIG. 9 illustrates a sectional view taken along a line B-B' of FIG. 8.

Figure 10:
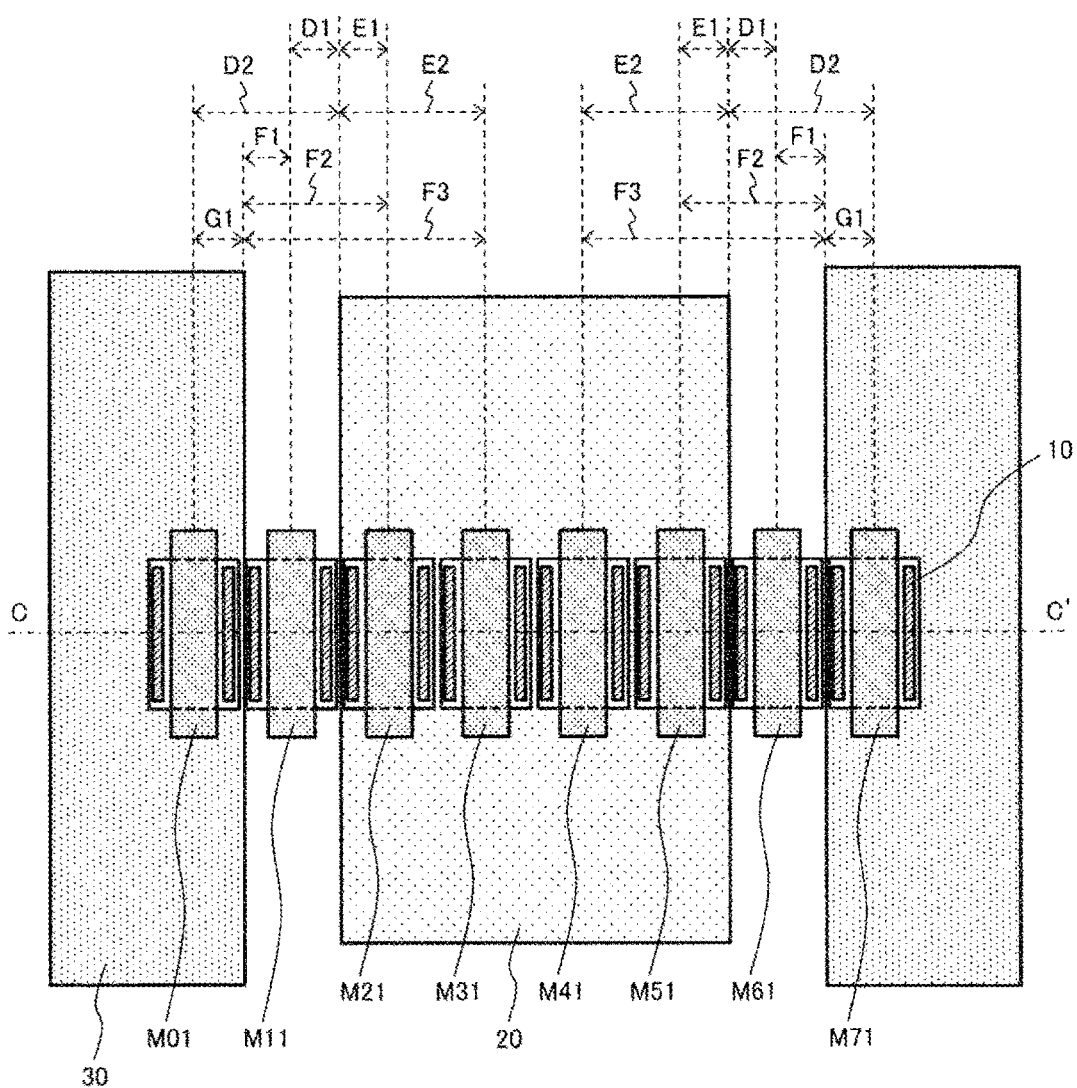
FIG. 10 is a partially enlarged view illustrating the semiconductor device in FIG. 8.
Figure 11:
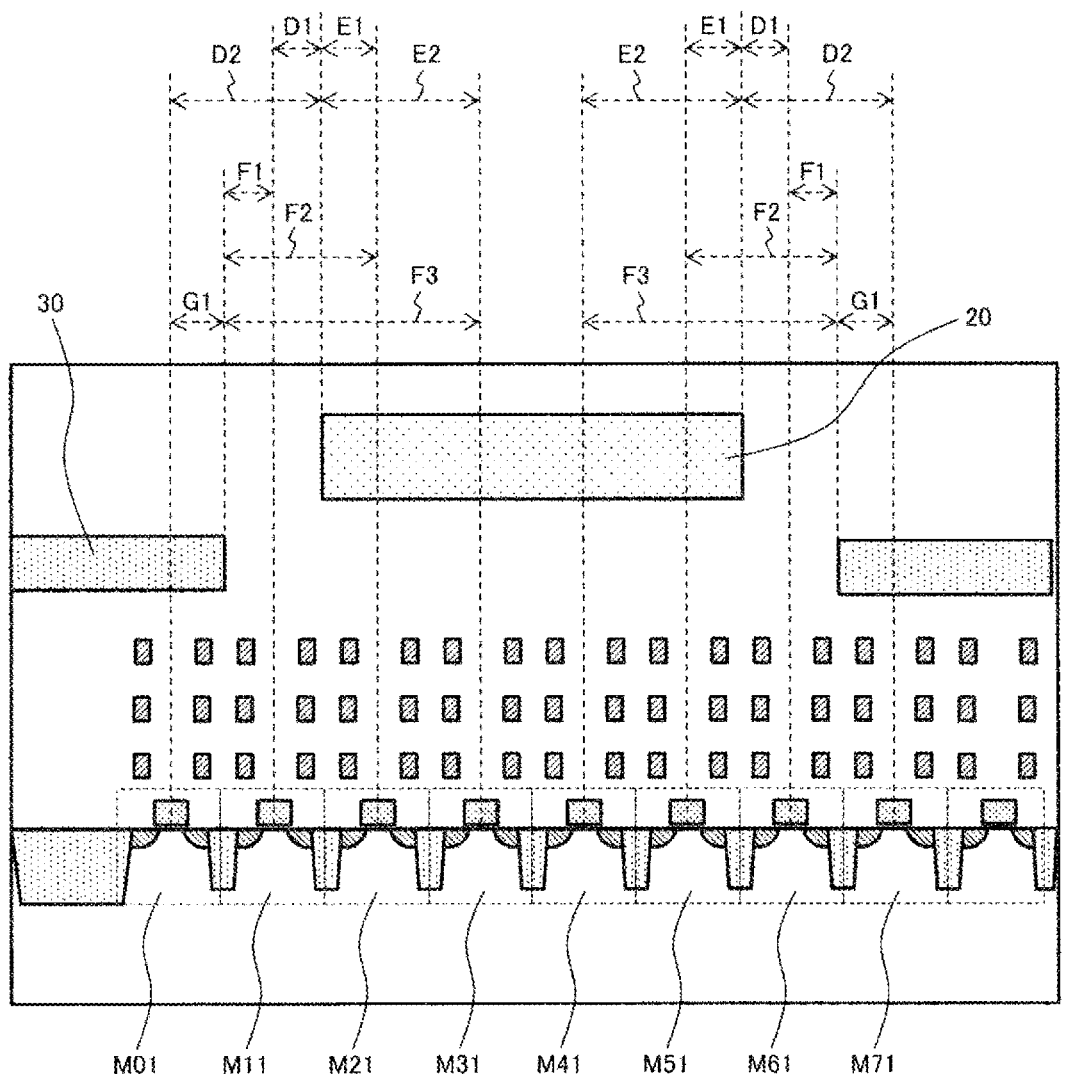
FIG. 11 is a sectional view taken along a line C-C' of FIG. 10.

The detailed arrangement of the MOS transistor, the wide wiring 20, and the wide wiring 30 of the second embodiment will be described below. FIG. 10 is an enlarged plan view illustrating regions of the eight MOS transistors M01 to M71 from the left of FIG. 8, and FIG. 11 is a sectional view taken along a line C-C' of FIG. 10. In FIGS. 10 and 11, distances D1, D2, E1, E2 in the planar direction between the MOS transistors M01 to M71 and the wide wiring 20 are the same as those in FIGS. 4 and 5 of the first embodiment.

As illustrated in FIGS. 10 and 11, the distances in the planar direction between the wide wiring 30 and the MOS transistors M01, M11, M21, M31 are set to G1, F1, F2, F3, respectively. The same applies to M41, M51, M61, M71.

By disposing the MOS transistor constituting the current mirror circuit in FIG. 9, the wide wiring 20 of the upper layer, and the wide wiring 30 of the wiring layer different from the wide wiring 20 as illustrated in FIG. 8, in each set of the MOS transistors connected to each of the terminal mirror 101 to 107 in the circuit diagram of FIG. 2, the distance in the planar direction from the MOS transistor to the wide wiring 30 becomes, for example, as follows, and all become the combination of F1, F2, F3, G1.

<<Mirror Terminal 100>> (Mirror Source)
Transistors M01 to M04: distances G1, F3, F2, F1 to wide wiring 30
<<Mirror Terminal 101>> (Mirror Destination)
Transistors M11 to M14: distances F1, G1, F3, F2 to wide wiring 30
<<Mirror Terminal 102>> (Mirror Destination)
Transistors M21 to M24: distances F2, F1, G1, F3 to wide wiring 30
<<Mirror Terminal 103>> (Mirror Destination)
Transistors M31 to M34: distance F3, F2, F1, G1 to wide wiring 30

As described above, the combination of the distances in the planar direction from the MOS transistor to the wide wiring 20 and the wide wiring 30 is the same between the terminals of the mirror source (100) and the mirror destination (101 to 107) of the current mirror circuit, and the influence of the stress of the wide wiring can be equalized between the terminals of the mirror source and the mirror destination, so that initial variation in the mirror ratio of the current mirror circuit can be reduced and aged degradation (change with time) can be suppressed.

As described above, in the semiconductor device of the second embodiment, the plurality of wirings include the plurality of wide wirings 20 disposed in the first wiring layer and the plurality of wide wirings 30 disposed in the second wiring layer different from the first wiring layer, the plurality of wide wirings 20 of the first wiring layer are disposed such that the combination of distances in the planar direction from each semiconductor element (MOS transistors M01, M11, M21, M31) of the first semiconductor element group (the group of the mirror terminal 100) to the wide wiring 20 disposed in the first wiring layer at the position closest in the planar direction is equal to the combination of distances in the planar direction from each semiconductor element (MOS transistors M41, M51, M61, M71) of the second semiconductor element group (the group of the mirror terminal 101) to the wide wiring 20 disposed in the first wiring layer at the closest position in the planar direction, and the plurality of wide wirings 30 of the second wiring layer are disposed such that the combination of distances in the planar direction from each semiconductor element (MOS transistors M01, M11, M21, M31) of the first semiconductor element group (the group of the mirror terminal 100) to the wide wiring 30 disposed in the second wiring layer at the position closest in the planar direction is equal to the combination of distances in the planar direction from each semiconductor element (MOS transistors M41, M51, M61, M71) of the second semiconductor element group (the group of the mirror terminal 101) to the wide wiring 30 disposed in the second wiring layer at the position closest in the planar direction.

Third Embodiment

Figure 12:
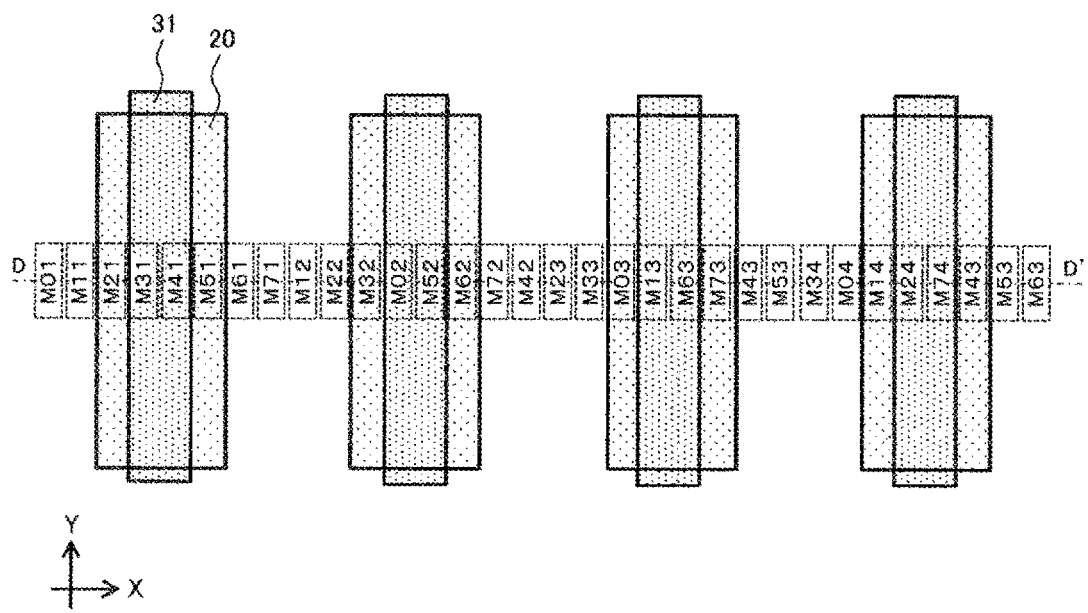
FIG. 12 is a plan view illustrating a semiconductor device according to a third embodiment of the present invention.
Figure 13:
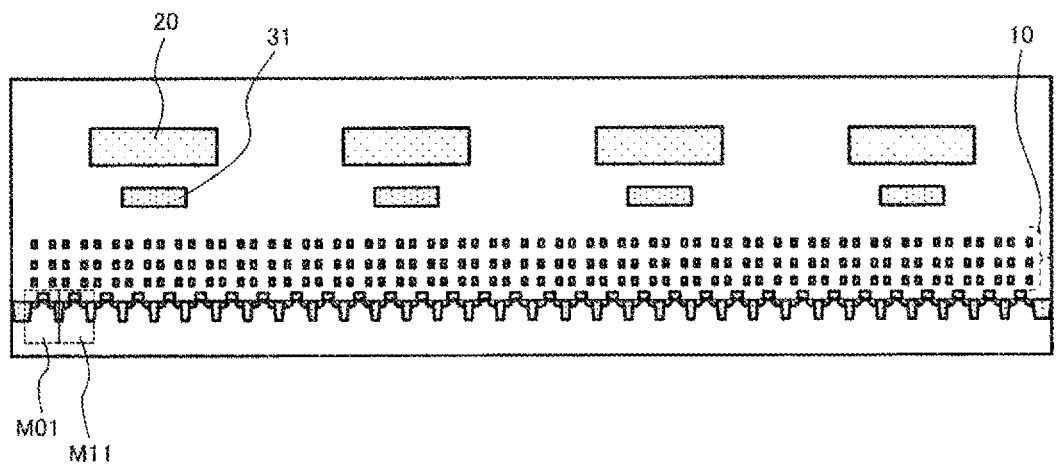
FIG. 13 is a sectional view taken along a line D-D' of FIG. 12.

A semiconductor device according to a third embodiment of the present invention will be described with reference to FIGS. 12 to 15. FIG. 12 is an example illustrating a planar positional relationship among MOS transistors M01 to M74 constituting a current mirror circuit in the semiconductor device of the third embodiment, a wide wiring 20, and a wide wiring 31 of a wiring layer different from the wide wiring 20. In FIG. 12, the MOS transistors M01 to M74 and the wide wiring 20 are the same as those in FIG. 1. The current mirror circuit of the second embodiment is the same as that in FIG. 2. FIG. 13 is a sectional view taken along a line D-D' of FIG. 12.

In the third embodiment, as illustrated in FIG. 13, the wide wiring 31 is disposed closer to the MOS transistor side (lower layer side) than the wide wiring 20.

Figure 14:
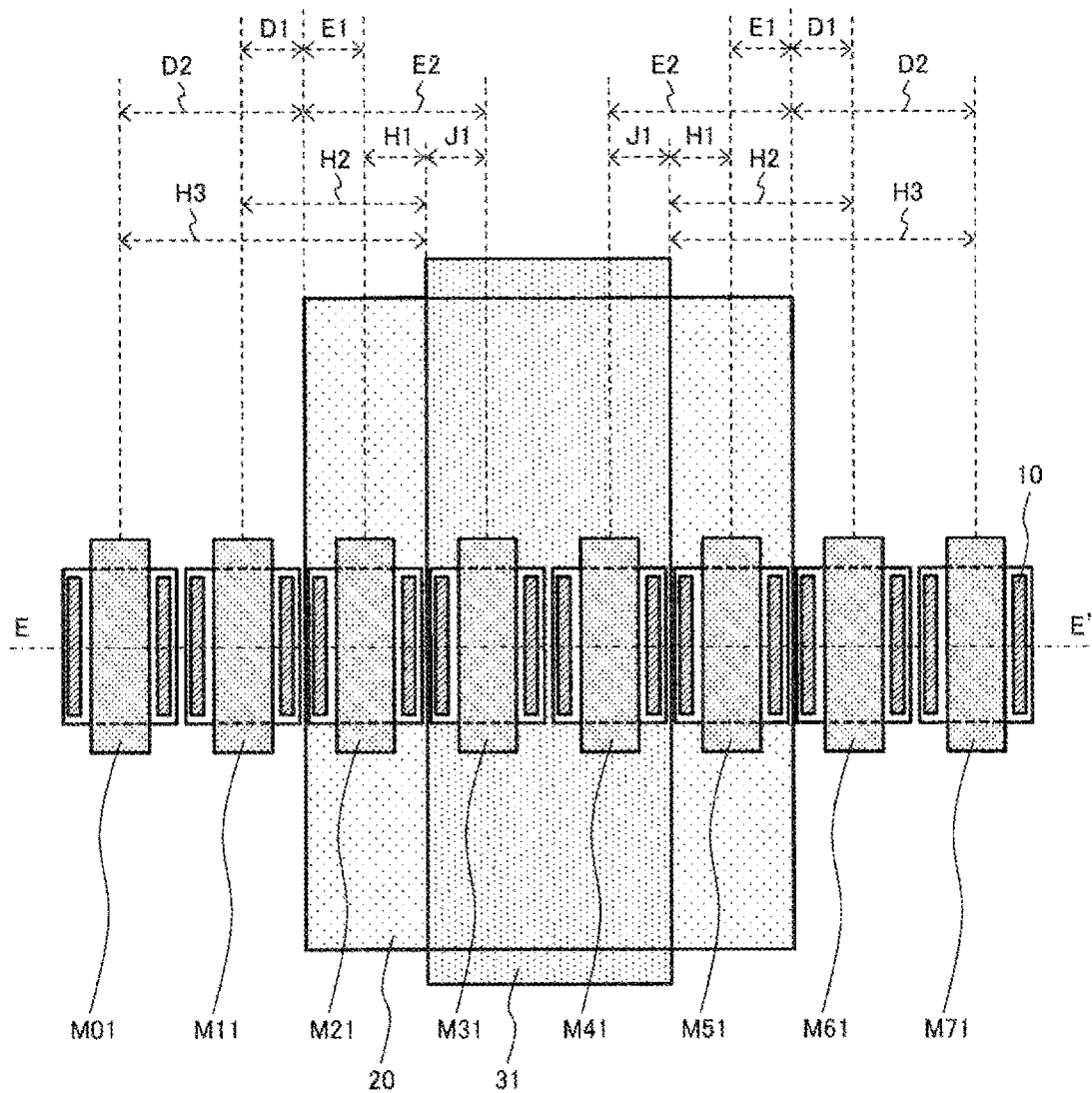
FIG. 14 is a partially enlarged view illustrating the semiconductor device in FIG. 12.
Figure 15:
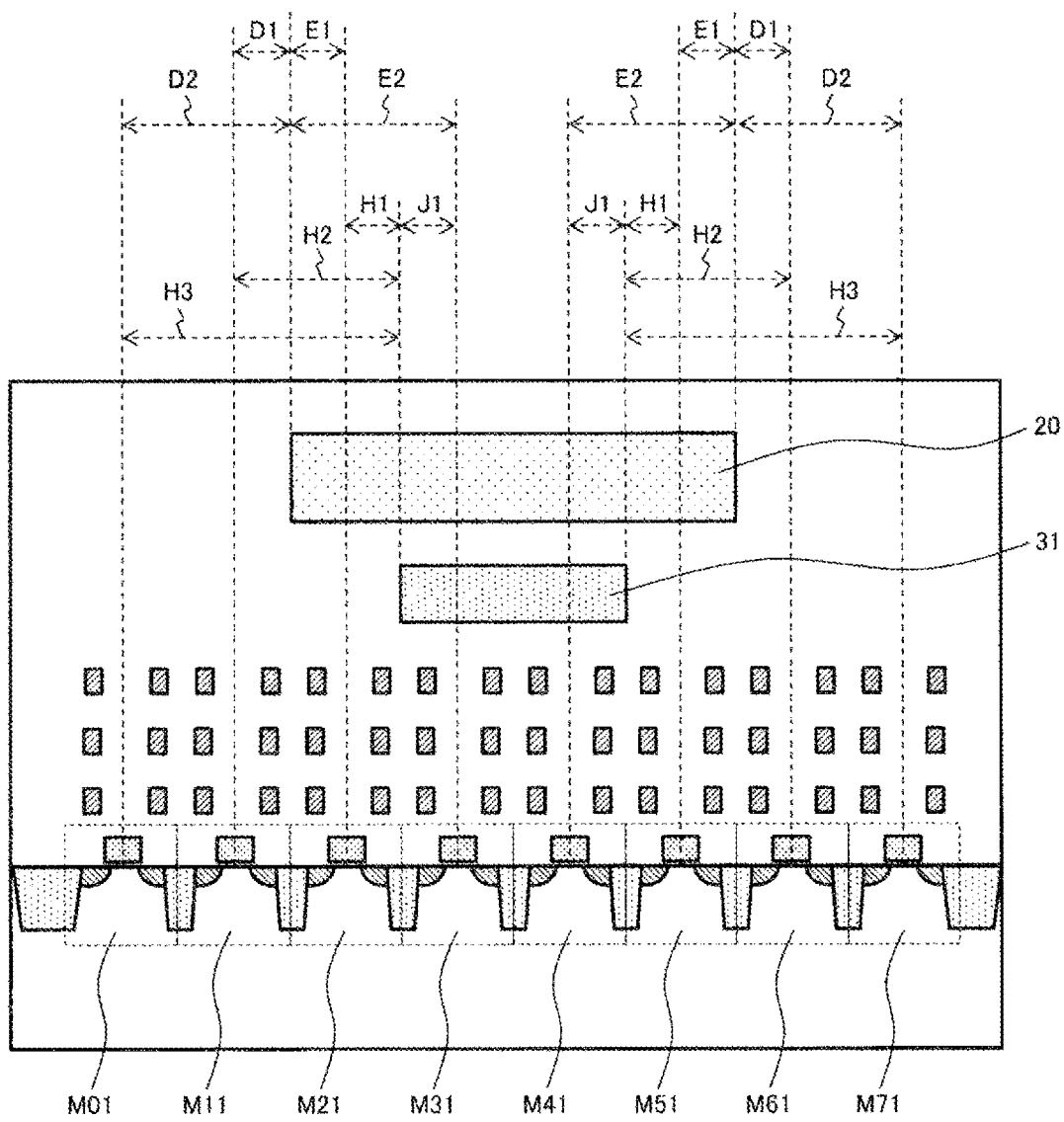
FIG. 15 is a sectional view taken along a line E-E' of FIG. 14.

Hereinafter, the detailed disposition of the MOS transistor, the wide wiring 20, and the wide wiring 31 of the third embodiment will be described below. FIG. 14 is an enlarged plan view illustrating regions of the eight MOS transistors M01 to M71 from the left of FIG. 12, and FIG. 15 is a sectional view taken along a line E-E' of FIG. 14. In FIGS. 14 and 15, distances D1, D2, E1, E2 in the planar direction between the MOS transistors M01 to M71 and the wide wiring 20 are the same as those in FIGS. 4 and 5 of the first embodiment.

In addition, distances in the planar direction between the region where the wide wiring 20 and the wide wiring 31 planarly overlap each other and the MOS transistors M01, M11, M21, M31 are set to H3, H2, H1, J1, respectively. When the MOS transistor constituting the current mirror circuit, the wide wiring 20 of the upper layer, and the wide wiring 31 are disposed as illustrated in FIGS. 12 and 13, in the set of MOS transistors connected to each mirror terminal 101 to 107 of the circuit diagram of FIG. 2, the distance in the planar direction from the MOS transistor to the overlapping region of the wide wiring 20 and the wide wiring 31 is, for example, as follows, and all become a combination of H1, H2, H3, J1.

<<Mirror Terminal 100>> (Mirror Source)
Transistors M01 to M04: distances H3, J1, H1, H2 to wide wiring 31
<<Mirror Terminal 101>> (Mirror Destination)
Transistors M11 to M14: distances H2, H3, J1, H1 to wide wiring 31
<<Mirror Terminal 102>> (Mirror Destination)
Transistors M21 to M24: distances H1, H2, H3, J1 to wide wiring 31
<<Mirror Terminal 103>> (Mirror Destination)
Transistors M31 to M34: Distances J1, H1, H2, H3 to the wide wiring 31

As described above, the combination of the distances in the planar direction from the MOS transistor to the wide wiring 20 and the wide wiring 31 and the combination of the distances in the planar direction from the MOS transistor to the overlapping of the wide wiring 20 and the wide wiring 31 are made the same for each combination of the mirror source of the current mirror circuit and the MOS transistor of the terminal of each mirror destination, whereby the influence of the stress of the wide wiring can be made equal between the mirror source and the mirror destination, and the initial variation reduction and the aging degradation (change with time) of the mirror ratio of the current mirror circuit can be suppressed.

As described above, in the semiconductor device of the third embodiment, the plurality of wirings include the plurality of wide wirings 20 disposed in the first wiring layer and the plurality of wide wirings 31 disposed in the second wiring layer different from the first wiring layer, the wide wiring 20 disposed in the first wiring layer and the wide wiring 31 disposed in the second wiring layer are disposed so as to overlap each other, and the wide wiring 20 disposed in the first wiring layer and the wide wiring 31 disposed in the second wiring layer are disposed such that the combination of distances in the planar direction from each semiconductor element (the MOS transistors M01, M11, M21, M31) of the first semiconductor element group (the group of the mirror terminal 100) to the position where the wide wiring 20 disposed in the first wiring layer closest to each semiconductor element in the planar direction overlaps the wide wiring 31 disposed in the second wiring layer is equal to the combination of distances in the planar direction from each semiconductor element (the MOS transistors M41, M51, M61, M71) of the second semiconductor element group (the group of the mirror terminal 101) to the position where the wide wiring 20 disposed in the first wiring layer closest in the planar direction overlaps the wide wiring 31 disposed in the second wiring layer.

Fourth Embodiment

Figure 16:
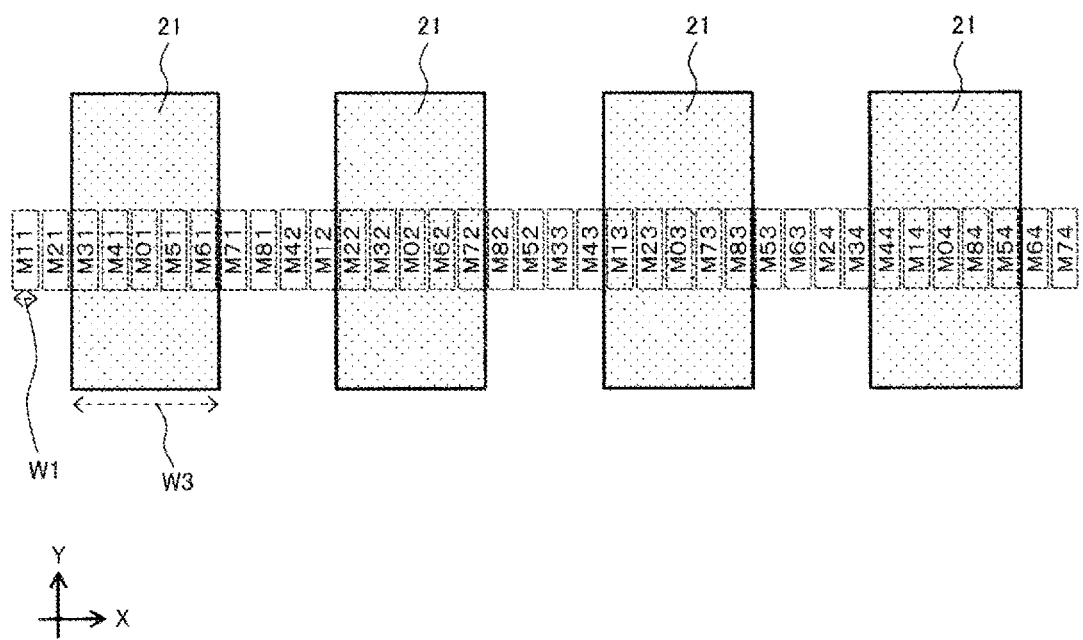
FIG. 16 is a plan view illustrating a semiconductor device according to a fourth embodiment of the present invention.
Figure 17:
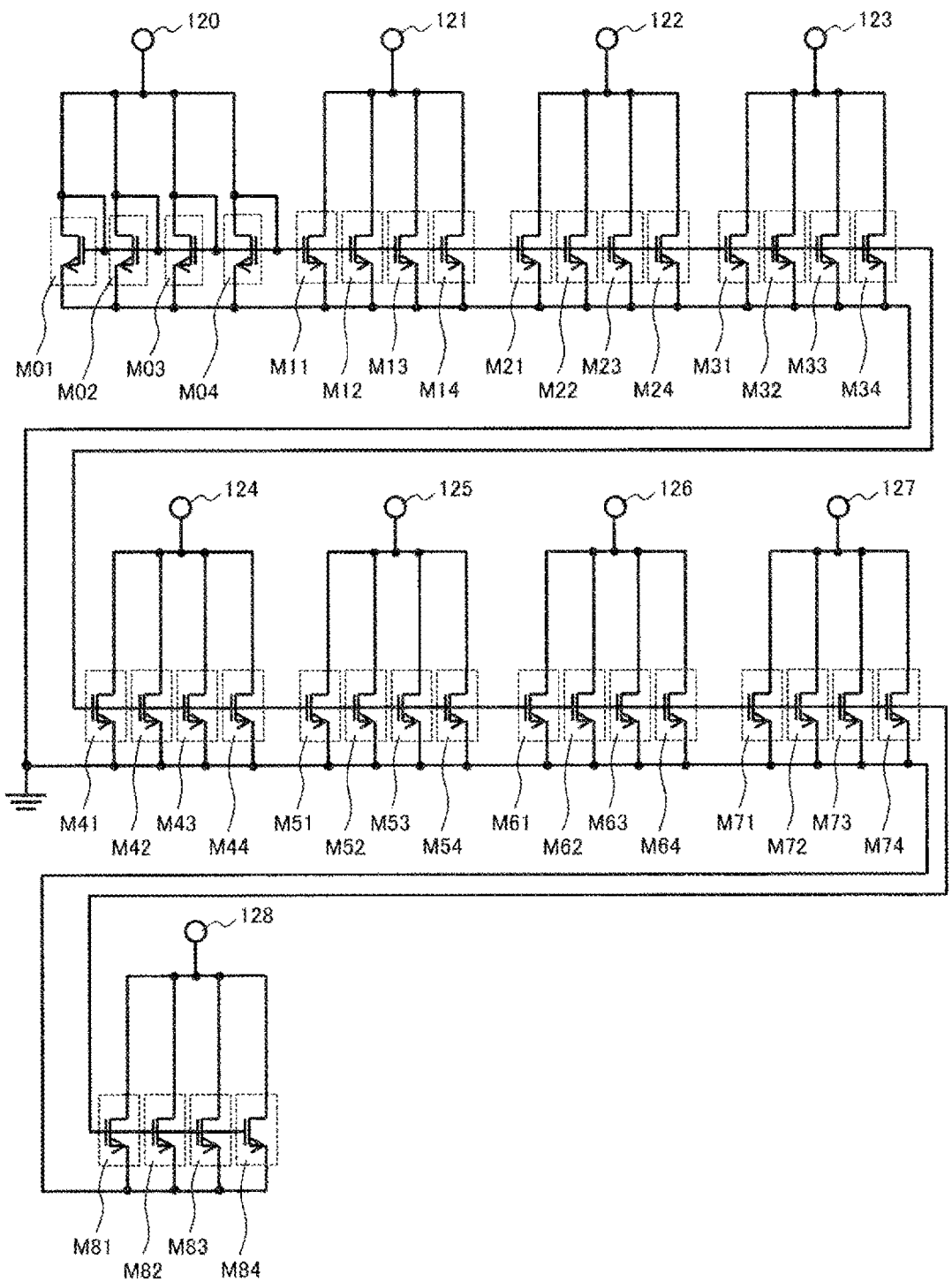
FIG. 17 is a circuit diagram illustrating the semiconductor device of the fourth embodiment of the present invention.

A semiconductor device according to a fourth embodiment of the present invention will be described with reference to FIGS. 16 to 18. FIG. 16 is an example illustrating a planar positional relationship between MOS transistors M01 to M84 constituting a current mirror circuit in the semiconductor device of the fourth embodiment and the wide wiring 21. FIG. 17 is a circuit diagram illustrating the current mirror circuit of FIG. 16. In FIG. 16, similarly to FIG. 1, the plurality of MOS transistors M01 to M84 are arranged in the X-direction, and the plurality of wide wirings 21 are disposed to extend in the Y-direction perpendicular to the MOS transistors M01 to M84. However, in the fourth embodiment, a width W3 of one wide wiring 21 is about 5 times the width W1 of one MOS transistor.

All the MOS transistors M01 to M04 connected to a mirror terminal 120 of the mirror source of FIG. 17 are disposed in a center of the wiring 21 in FIG. 16. On the other hand, similarly to the first embodiment (FIG. 1), the MOS transistors M11 to M84 of the mirror destinations are arranged while the order is changed one by one. In the arrangement of FIG. 17, the combination of distances in the planar direction from each mirror destination to the nearest mirror source is the same between the mirror terminals of the mirror destinations. For this reason, the variation depending on the distance from the mirror source can be reduced.

Figure 18:
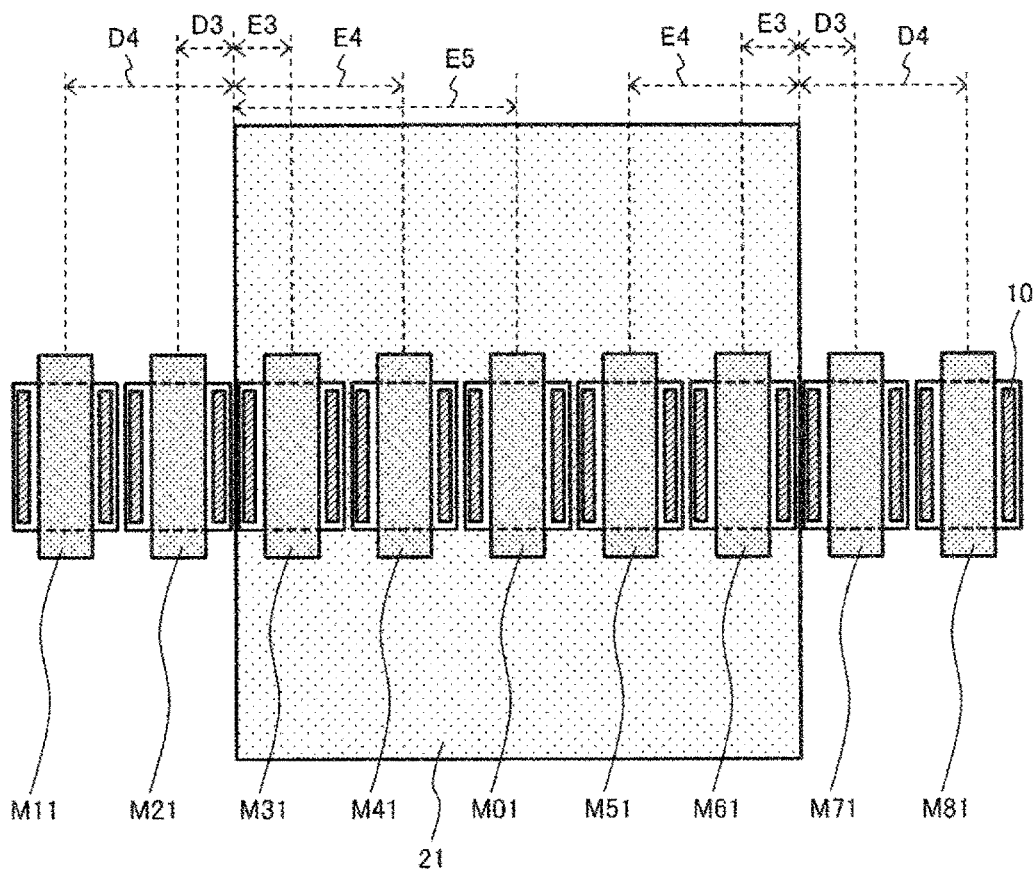
FIG. 18 is a partially enlarged view illustrating the semiconductor device in FIG. 16.

FIG. 18 is an enlarged plan view illustrating regions of the nine transistors M11 to M81 from the left of FIG. 16. The distances in the planar direction from the MOS transistors M11, M21, M31, M41 to the wiring ends of the wide wirings 21 are defined as D4, D3, E3, E4, respectively.

The same applies to M51 to M81.

In each of mirror terminal 121 to 128 of the mirror destination of FIG. 17, by arranging the MOS transistor and the wide wiring 21 as illustrated in FIG. 16, the combinations of the distances in the planar direction from the MOS transistor to the wide wiring 21 become D3, D4, E3, E4. Thus, the variation in the mirror ratio between the mirror destinations is reduced because the influence of the wide wiring of each mirror destination becomes equal.

However, the mirror source is different from the mirror destination in the influence of wiring stress. For this reason, in the case of the fourth embodiment, sizes of the MOS transistors of the mirror source and the mirror destination are adjusted so as to obtain a required mirror ratio, and the mirror ratio is corrected by calibration after the semiconductor integrated circuit device is manufactured.

Furthermore, the correction is required when there is the variation in the mirror ratio over a long period of time. However, because the influence of the strain due to the wide wiring between the mirror destinations is the same, the correct of the mirror ratio is not required for each mirror destination, and the correction can be simplified.

As described above, in the semiconductor device of the fourth embodiment, the circuit is the current mirror circuit, the semiconductor device further includes the third semiconductor element group (the group of the mirror terminal 120) in which the plurality of semiconductor elements (the MOS transistors M01 to M04) are connected in parallel, the first semiconductor element group (the group of the mirror terminal 121) and the second semiconductor element group (the group of the mirror terminal 122) are the mirror destination of the current mirror circuit, and the third semiconductor element group (the group of the mirror terminal 120) is the mirror source of the current mirror circuit.

In addition, the plurality of semiconductor element groups are included as the mirror destination (the groups of the mirror terminals 121 to 128), and each combination of distances in the planar direction from each semiconductor element in the plurality of semiconductor element groups (the groups of the mirror terminals 121 to 128) to the wide wiring 21 at the position closest in the planar direction is equal to the combination of distances in the planar direction in the first semiconductor element group (the group of the mirror terminal 121).

Fifth Embodiment

Figure 19:
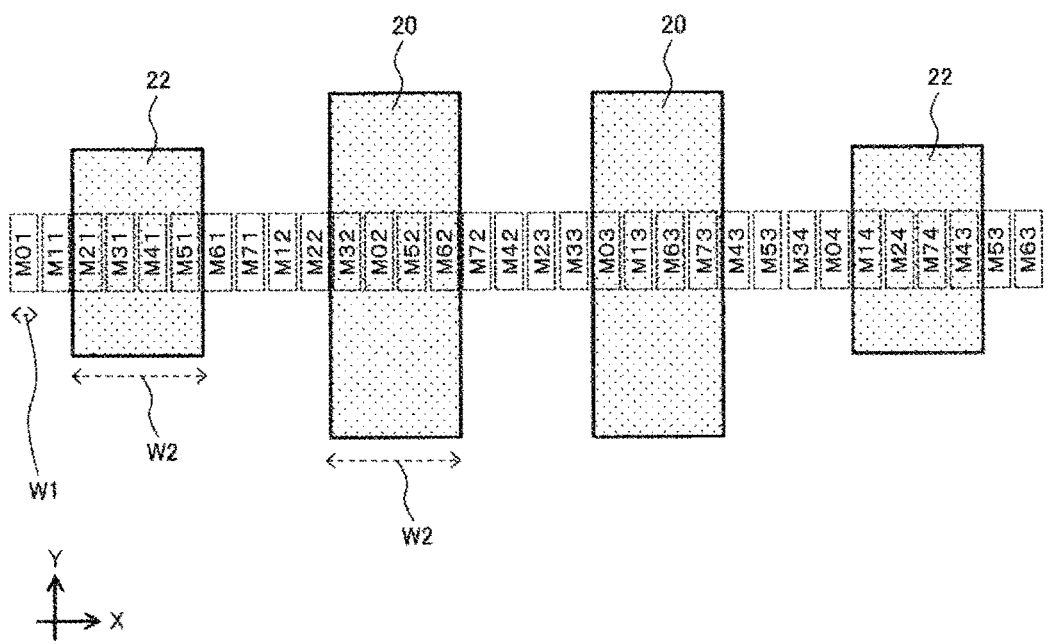
FIG. 19 is a plan view illustrating a semiconductor device according to a fifth embodiment of the present invention.

A semiconductor device according to a fifth embodiment of the present invention will be described with reference to FIG. 19. FIG. 19 is an example illustrating a planar positional relationship between MOS transistors M01 to M74 constituting a current mirror circuit in the semiconductor device of the fifth embodiment, a wide wiring 20, and a dummy wiring 22 in the same wiring layer as the wide wiring 20. The current mirror circuit of the fifth embodiment is the same as that in FIG. 2.

In the fifth embodiment, only two wide wirings 20 are disposed with respect to the arrangement of the MOS transistors M01 to M74 constituting the current mirror circuit. The dummy wiring 22 having the same width as the wide wiring 20 is disposed in the same wiring layer at a part of the position where the wide wiring 20 is disposed in FIG.

1. For the same reason as in the fifth embodiment, the dummy wiring 22 has an effect of equalizing the influence of the stress applied to the MOS transistor from the wide wiring 20 between the terminals of the mirror destination and the mirror source.

As illustrated in the stress simulation result of FIG. 3B, because the stress applied to the silicon is different between the wiring end and the wiring center, the dummy wiring 22 in FIG. 19 needs to be extended in the Y-direction from the MOS transistor arrangement.

Sixth Embodiment

Figure 20:
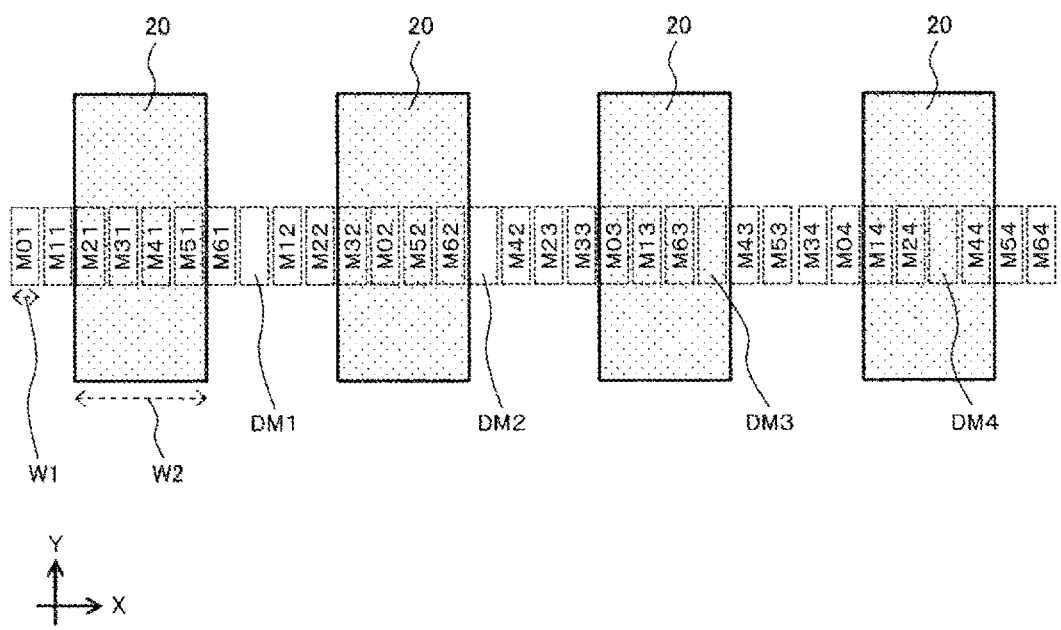
FIG. 20 is a plan view illustrating a semiconductor device according to a sixth embodiment of the present invention.
Figure 21:
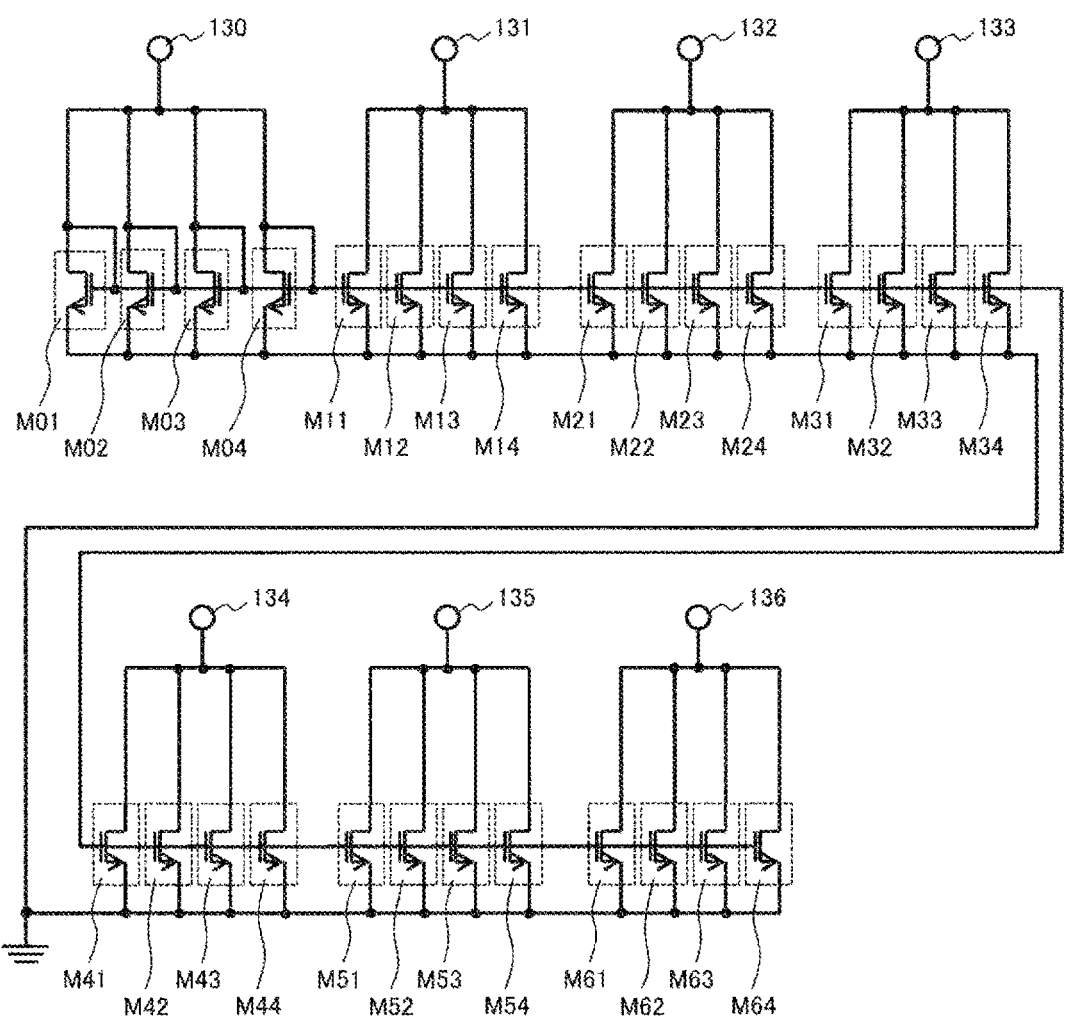
FIG. 21 is a circuit diagram illustrating the semiconductor device of the sixth embodiment of the present invention.

A semiconductor device according to a sixth embodiment of the present invention will be described with reference to FIGS. 20 and 21. FIG. 20 is an example illustrating a planar positional relationship between MOS transistors M01 to M64 constituting a current mirror circuit in the semiconductor device of the sixth embodiment and a wide wiring 20. Similarly to the first embodiment (FIG. 1), the MOS transistors M01 to M64 are arranged in the X-direction, and the wide wiring 20 is disposed to extend in the Y-direction perpendicular to the MOS transistors M01 to M64. A width W2 of one wide wiring 20 is about 4 times a width W1 of one MOS transistor. FIG. 21 is a circuit diagram illustrating the current mirror circuit of FIG. 20.

In FIG. 20, dummy transistors DM1 to DM4 that are dummy semiconductor elements are disposed in the MOS transistor array in order to adjust the positions of the MOS transistors M01 to M64 and the wide wiring 20. Thus, similarly to the first embodiment (FIG. 1), in the set of MOS transistors for the mirror terminal 130 to 136 in FIG. 21, the combination of the distances in the planar direction from the MOS transistor to the width wiring 20 closest to the MOS transistor is the same, so that the influence of the stress of the width wiring 20 can be equalized between the mirror source and the mirror destination, and the initial variation reduction and the aging degradation (aging) of the mirror ratio of the current mirror circuit can be suppressed.

The first to sixth embodiments are the arrangement examples of the MOS transistor set connected in parallel to the mirror terminal of the current mirror circuit and the upper layer wiring. However, in addition to the MOS transistor, for example, a semiconductor element such as a bipolar transistor or a semiconductor resistance element and the upper layer wiring thereof may be disposed.

The present invention is not limited to the above embodiments, but includes various modifications.

For example, the above embodiments are described in detail in order to explain the present invention in an easy-to-understand manner, and the above embodiments are not necessarily limited to a case including all the described configurations. Furthermore, some components in one example can be replaced with the components in another example, and the configuration of another example can be added to the configuration of one example. Furthermore, regarding some components in the examples, other components can be added, deleted, and replaced.

REFERENCE SIGNS LIST

MO to M7 MOS transistor
M01 to M84 MOS transistor
DM1 to DM4 dummy transistor
10 (metal) wiring layer
20, 21 wide (metal) wiring
22 dummy wiring (of same wiring layer as metal wiring 20)
30, 31 wide (metal) wiring (of wiring layer different from metal wiring 20)
W1 to W3 transistor size or metal wiring width
100 to 107 mirror terminal (of current mirror circuit)
110 to 117 mirror terminal (of current mirror circuit)
120 to 128 mirror terminal (of current mirror circuit)
130 to 136 mirror terminal (of current mirror circuit)
D1 to D4 distance (in planar direction from MOS transistor to wide metal wiring)
E1 to E5 distance (in planar direction from MOS transistor to wide metal wiring)
F1 to F3 distance (in planar direction from MOS transistor to wide metal wiring)
G1 distance (in planar direction from MOS transistor to wide metal wiring)
H1 to H3 distance (in planar direction from MOS transistor to overlap of wide metal wiring)
J1 distance (in planar direction from MOS transistor to overlap of wide metal wiring)
200 copper wiring
300 silicon substrate (semiconductor substrate)
301 silicon (Si) layer
302 interface between silicon layer 301 and silicon oxide film 401
400 silicon oxide film
401 silicon oxide film (interlayer oxide film)
500 polyimide film

The invention claimed is:

1. A current mirror circuit comprising:
a first semiconductor element group in which a plurality of semiconductor elements are connected in parallel;
a second semiconductor element group disposed in a layer identical to the first semiconductor element group and in which a plurality of semiconductor elements are connected in parallel; and
a plurality of wirings disposed in an upper layer of the first semiconductor element group and the second semiconductor element group, each of the plurality of wirings having a width greater than a width of each semiconductor element of the first semiconductor element group and the second semiconductor element group,
wherein the first semiconductor element group and the second semiconductor element group to constitute a circuit, and
the plurality of wirings are disposed such that a combination summation of distances in a lateral direction from each semiconductor element of the first semiconductor element group to a wiring at a position between the first semiconductor element group and the second semiconductor element group is equal to a summation of distances in the lateral direction from each semiconductor element of the second semiconductor element group.

2. The semiconductor device current mirror circuit according to claim 1, wherein
the plurality of wirings include a plurality of wirings disposed in a first wiring layer and a plurality of wirings disposed in a second wiring layer different from the first wiring layer,
the plurality of wirings of the first wiring layer are disposed such that the summation of distances in the lateral direction from each semiconductor element of the first semiconductor element group to a wiring disposed in the first wiring between the first semiconductor element group and the second semiconductor element group are equal to the summation of distances in the lateral direction from each semiconductor element of the second semiconductor element group to the wiring disposed in the first wiring layer, and the plurality of wirings of the second wiring layer are disposed such that the summation of distances in the lateral direction from each semiconductor element of the first semiconductor element group to the wiring disposed in the second wiring layer at the position between the first semiconductor element group and the second semiconductor element group is equal to the summation of distances in the lateral direction from each semiconductor element of the second semiconductor element group to the wiring disposed in the second wiring layer.

3. The current mirror circuit according to claim 1, wherein the plurality of wirings include a plurality of wirings disposed in a first wiring layer and a plurality of wirings disposed in a second wiring layer different from the first wiring layer, the wiring disposed in the first wiring layer and the wiring disposed in the second wiring layer are disposed so as to overlap each other, and the wiring disposed in the first wiring layer and the wiring disposed in the second wiring layer are disposed such that the summation of distances in the lateral direction from each semiconductor element of the first semiconductor element group to a position where the wiring disposed in the first wiring layer closest to each semiconductor element in the lateral direction overlaps the wiring disposed in the second wiring layer is equal to the summation of distances in the lateral direction from each semiconductor element of the second semiconductor element group to a position where the wiring disposed in the first wiring layer overlaps the wiring disposed in the second wiring layer.

4. The current mirror circuit according to claim 1, wherein the circuit is a current mirror circuit, the first semiconductor element group is a mirror source of the current mirror circuit, and the second semiconductor element group is a mirror destination of the current mirror circuit.

5. The current mirror circuit according to claim 1, further comprising a third semiconductor element group in which a plurality of semiconductor elements are connected in parallel, wherein the circuit is a current mirror circuit, the first semiconductor element group and the second semiconductor element group are a mirror destination of the current mirror circuit, and the third semiconductor element group is a mirror source of the current mirror circuit.

6. The current mirror circuit according to claim 4, further comprising a plurality of semiconductor element groups serving as a mirror destination, wherein each summation of distances in the lateral direction from each semiconductor element in the plurality of semiconductor element groups to the wiring at a position closest in the distance in the lateral direction is equal to a summation of distances in the lateral direction in the first semiconductor element group.

7. The current mirror circuit according to claim 1, wherein the plurality of wirings include a dummy wiring.

8. The current mirror circuit according to claim 1, wherein an arrangement of the plurality of semiconductor elements includes a dummy semiconductor element.

9. A semiconductor device comprising the current mirror circuit according to claim 1.

* * * * *